United States Patent
Singh

(10) Patent No.: US 9,563,220 B1
(45) Date of Patent: Feb. 7, 2017

(54) DYNAMIC OPERATING SURFACE FOR INTEGRATED CIRCUITS

(71) Applicant: Apple Inc., Cupertino, CA (US)

(72) Inventor: Preminder Singh, Belmont, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/974,849

(22) Filed: Dec. 18, 2015

Related U.S. Application Data

(63) Continuation-in-part of application No. 14/168,177, filed on Jan. 30, 2014, now Pat. No. 9,291,670.

(51) Int. Cl.
*H01L 25/00* (2006.01)
*G05F 3/02* (2006.01)

(52) U.S. Cl.
CPC ...................... *G05F 3/02* (2013.01)

(58) Field of Classification Search
CPC ...... E21B 36/04; E21B 43/24; E21B 43/2401; Y10T 29/49083
See application file for complete search history.

(56) References Cited

U.S. PATENT DOCUMENTS

| | | | |
|---|---|---|---|
| 7,142,996 B2 | 11/2006 | Patel et al. | |
| 7,475,366 B2 | 1/2009 | Kuemerle et al. | |
| 8,421,495 B1 | 4/2013 | Anemikos et al. | |
| 2012/0013353 A1 | 1/2012 | Frech | |
| 2012/0147507 A1* | 6/2012 | Rivers, Jr. ............ | H02J 3/1828 361/42 |
| 2013/0124133 A1 | 5/2013 | Anemikos et al. | |
| 2014/0068283 A1* | 3/2014 | Bickford .................. | G06F 1/32 713/300 |

OTHER PUBLICATIONS

U.S. Appl. No. 13/868,540, filed Apr. 23, 2013, Preminder Singh.
Office action in U.S. Appl. No. 14/168,177 issued Aug. 14, 2015.

* cited by examiner

*Primary Examiner* — Sibin Chen
(74) *Attorney, Agent, or Firm* — Meyertons, Hood, Kivlin, Kowert & Goetzel, P.C.; Gareth M. Sampson; Lawrence J. Merkel

(57) ABSTRACT

A device includes an integrated circuit programmed with an operating surface equation. The operating surface equation may define an operating point as a function of operating voltage, operating frequency, leakage current, and one or more additional operating factors. The additional operating factors may be, for example, an operating temperature of the integrated circuit, a number of active execution units in the integrated circuit, and/or an age of the integrated circuit. The operating surface equation may be adjusted based on changes in one or more of the additional operating factors. Changes in the operating surface equation may change the operating surface of the integrated circuit. Thus, operating points (e.g., operating voltage) of the integrated circuit may be adjusted in response to changes in the additional operating factors.

20 Claims, 12 Drawing Sheets

DYNAMIC OPERATING SURFACE FOR INTEGRATED CIRCUITS

PRIORITY CLAIM

This application is a continuation-in-part of U.S. patent application Ser. No. 14/168,177 to Singh et al., entitled "OPERATING SURFACE CHARACTERIZATION FOR INTEGRATED CIRCUITS", filed Jan. 30, 2014, which is incorporated by reference in its entirety.

BACKGROUND

1. Technical Field

Embodiments described herein relate to semiconductor devices and methods for operation of semiconductor devices. More particularly, embodiments described herein relate to testing and characterization of semiconductor devices such as integrated circuits, and the programming and operation of the integrated circuits based on the characterization and testing.

2. Description of Related Art

Overall power consumption for semiconductor devices (e.g., semiconductor integrated circuits (ICs) such as logic or memory ICs) is a combination of dynamic (active) power consumption and static (leakage) power consumption. As devices have reduced in size and the power requirements (especially dynamic power requirements) have been reduced, static power consumption has become a more significant factor in overall power consumption for integrated circuits and semiconductor devices. Static power consumption is especially important in portable electronic devices as static (idle) power consumption directly affects battery life. Thus, the control and optimization of static power consumption is increasingly needed for the production of semiconductor devices used in portable electronic devices as well as other electronic devices.

Variations during the manufacturing of integrated circuits (e.g., variations during IC processing) may cause variation between integrated circuits that are manufactured to the same design specifications. For example, manufacturing variations such as, but not limited to, equipment variations, position on a wafer, process fluctuations, and/or operator variations may cause one or more parameters to vary between integrated circuits formed on the same wafer, integrated circuits formed in the same lot (batch), and/or integrated circuits formed on different wafers in different lots. Because of these manufacturing variations, integrated circuits with the same design may have different static power consumption characteristics. Using integrated circuits with excessive power consumption may lead to decreased battery life and/or decreased operational lifetime in electronic devices such as portable electronic devices.

SUMMARY

In certain embodiments, a device includes an integrated circuit programmed with an adjustable operating surface equation. The operating voltage of the integrated circuit may be determined by evaluating the operating surface equation at a given operating frequency, a leakage current value fused into the device, and current (present) values of one or more additional operating factors. The additional operating factors may include an operating temperature of the integrated circuit, a number of active execution units in the integrated circuit, and/or an age of the integrated circuit.

One or more of the additional operating factors may change during operation of the integrated circuit. In certain embodiments, the operating surface equation is adjusted when changes from the current values of the additional operating factors are detected. Adjusting the operating surface equation may adjust the operating surface for the integrated circuit in response to detected changes in the additional operating factors. Thus, operating points such as operating voltage for the integrated circuit may be dynamically adjusted in response to detected changes in the additional operating factors. The operating surface equation may be adjusted by adjusting one or more parameters in the operating surface equation that are associated with the additional operating factors. The adjustment parameters may be determined from testing and/or simulation data for the affects of the additional operating factors on the operating surface of the integrated circuit.

BRIEF DESCRIPTION OF THE DRAWINGS

Features and advantages of the methods and apparatus of the embodiments described in this disclosure will be more fully appreciated by reference to the following detailed description of presently preferred but nonetheless illustrative embodiments in accordance with the embodiments described in this disclosure when taken in conjunction with the accompanying drawings in which.

Figure 1:
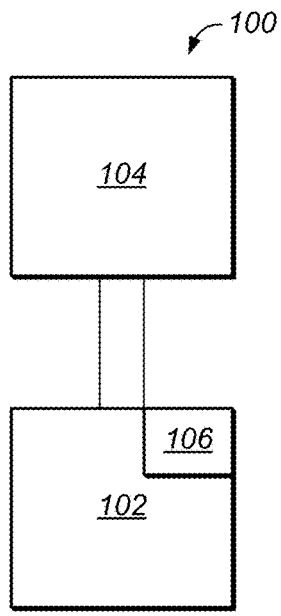
FIG. 1 depicts a schematic representation of an embodiment of a semiconductor device with an integrated circuit and a power supply.

While embodiments described in this disclosure may be susceptible to various modifications and alternative forms, specific embodiments thereof are shown by way of example in the drawings and will herein be described in detail. It should be understood, however, that the drawings and detailed description thereto are not intended to limit the embodiments to the particular form disclosed, but on the contrary, the intention is to cover all modifications, equivalents and alternatives falling within the spirit and scope of the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits and/or memory storing program instructions executable to implement the operation. The memory can include volatile memory such as static or dynamic random access memory and/or nonvolatile memory such as optical or magnetic disk storage, flash memory, programmable read-only memories, etc. The hardware circuits may include any combination of combinatorial logic circuitry, clocked storage devices such as flops, registers, latches, etc., finite state machines, memory such as static random access memory or embedded dynamic random access memory, custom designed circuitry, programmable logic arrays, etc. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112(f) interpretation for that unit/circuit/component.

In an embodiment, hardware circuits in accordance with this disclosure may be implemented by coding the description of the circuit in a hardware description language (HDL) such as Verilog or VHDL. The HDL description may be synthesized against a library of cells designed for a given integrated circuit fabrication technology, and may be modified for timing, power, and other reasons to result in a final design database that may be transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and may further include other circuit elements (e.g. passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

DETAILED DESCRIPTION OF EMBODIMENTS

This specification includes references to "one embodiment" or "an embodiment." The appearances of the phrases "in one embodiment" or "in an embodiment" do not necessarily refer to the same embodiment, although embodiments that include any combination of the features are generally contemplated, unless expressly disclaimed herein. Particular features, structures, or characteristics may be combined in any suitable manner consistent with this disclosure.

FIG. 1 depicts a schematic representation of an embodiment of a semiconductor device with an integrated circuit and a power supply. Device 100 includes integrated circuit 102 and power supply 104. Integrated circuit 102 may be, for example, a memory or logic integrated circuit (die). In certain embodiments, integrated circuit 102 is a semiconductor based device. Integrated circuit 102 may be coupled to power supply 104. Power supply 104 provides a supply (operating) voltage to integrated circuit 102 for operation of the integrated circuit. Power supply 104 may, for example, provide power for logic and/or memory functions (operations) in integrated circuit 102 at one or more selected operating voltages.

In some embodiments, integrated circuit 102 is provided with more than one supply voltage. For example, integrated circuit 102 may include both logic and memory functions and operate at separate supply voltages for each function. The supply voltages for each function may be set at different values (e.g, the supply voltages are not identical). In some embodiments, power supply 104 provides power for each function of integrated circuit 102 (e.g., for both logic and memory functions). In some embodiments, one or more additional power supplies are used to provide power for additional functions in integrated circuit 102 (e.g., power supply 104 provides power for the logic function while another power supply provides power for the memory function).

In some embodiments, integrated circuit 102 is operable at different frequencies. The operating frequency of integrated circuit 102 may be adjusted (e.g., raised or lowered) based on operational needs. For example, the operating frequency of integrated circuit 102 may be higher for high performance operations and lower for low performance operations. In some embodiments, supply voltage provided to integrated circuit 102 is adjusted in combination with the operating frequency of the integrated circuit.

In certain embodiments, integrated circuit 102 includes fuse block 106. Fuse block 106 may include one or more fuse programming circuits. In some embodiments, fuse block 106 includes one or more fuses programmed for responding to current (e.g., leakage current) in integrated circuit 102.

Figure 2:
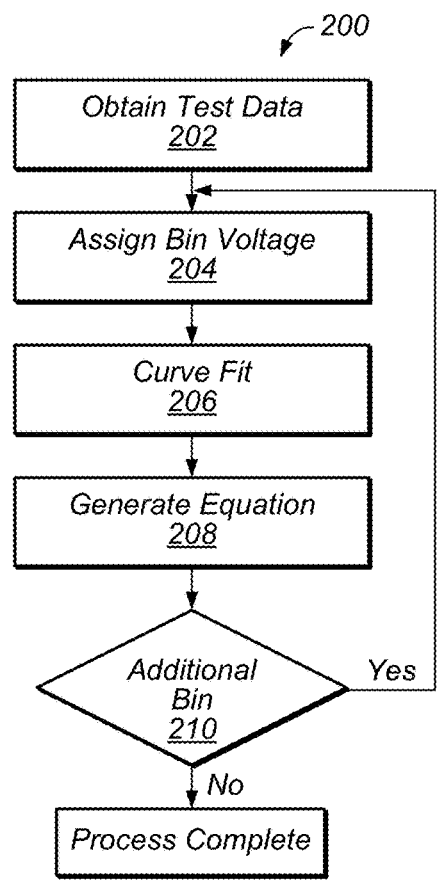
FIG. 2 depicts a flowchart of an embodiment for creating and assigning bins used for binning integrated circuits.

FIG. 2 depicts a flowchart of an embodiment for creating and assigning bins used for binning integrated circuits (e.g., integrated circuit 102). Process 200 for creating and assigning bins using testing data begins with "Obtain test data" 202. "Obtain test data" 202 includes obtaining testing data of operating voltage versus leakage current for one or more test integrated circuits. The test integrated circuits used for obtaining the testing data in 202 may be, for example, integrated circuits with a selected circuit design (e.g., a logic or memory circuit design). The selected circuit design may be the same design, or a substantially similar design, to a circuit design for integrated circuits that will be used in one or more devices (e.g., device 100).

Figure 3:
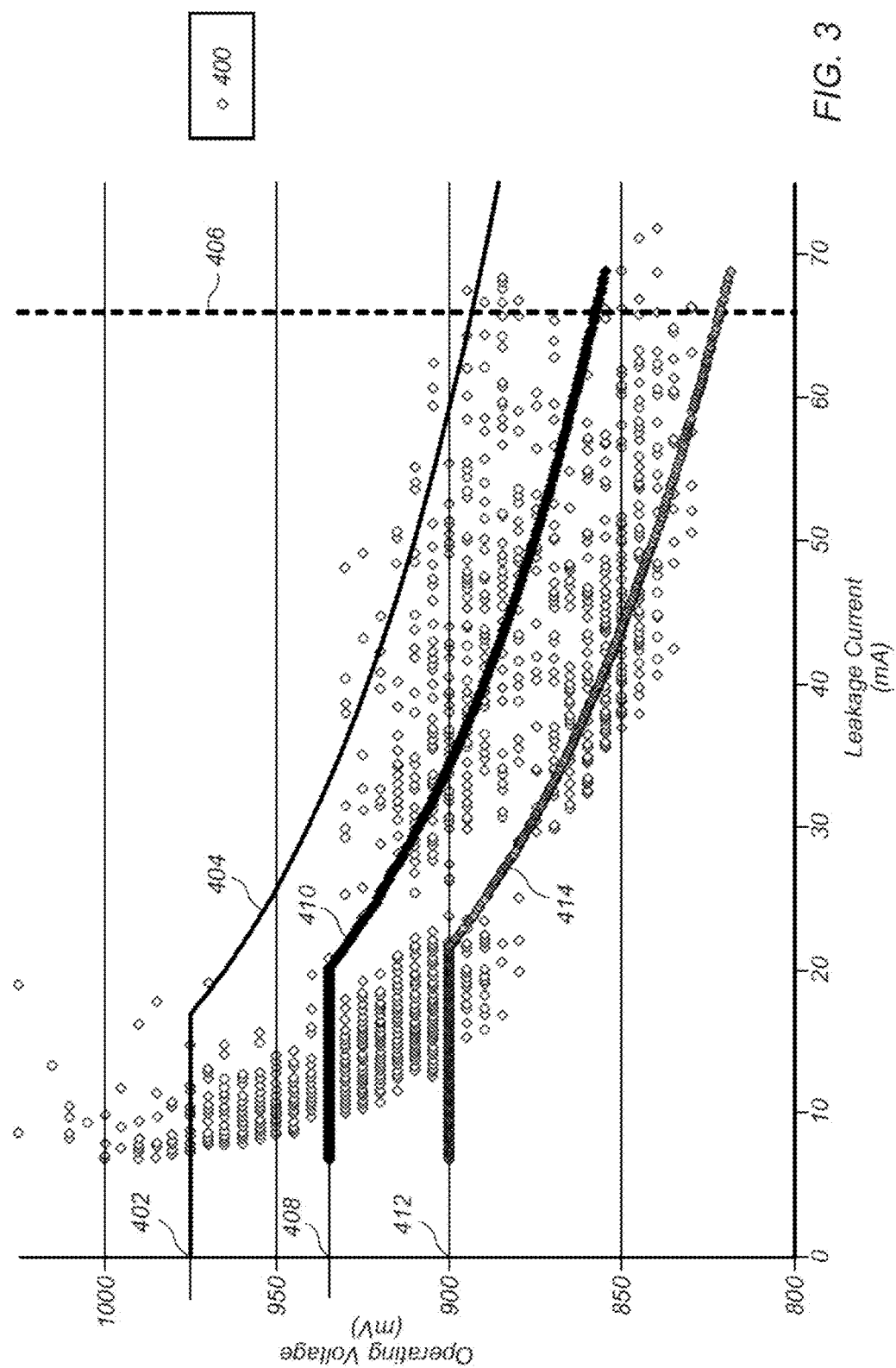
FIG. 3 depicts one embodiment of a plot of population testing data with operating voltage versus leakage current data.

Obtaining the testing data in 202 may include measuring leakage currents at a plurality of operating voltages provided to the test integrated circuits. Operating voltages that may be tested include, but are not limited to, logic supply voltage, memory supply voltage, and Input/Output supply voltage. The testing data then includes a "population" of operating voltage versus leakage current data for the selected circuit design. FIG. 3 depicts one embodiment of a plot of population testing data with operating voltage versus leakage current data 400 represented by diamond symbols.

After obtaining the testing data in 202, an initial bin operating voltage is assigned to the testing data in "Assign bin voltage" 204, as shown in FIG. 2. In 204, the initial bin operating voltage may be assigned based on a selected power output for the selected circuit design. The selected power output may be selected to correspond to operating characteristics of a desired device implementing the selected circuit design. For example, the selected power output may correspond to allowable static power drain in the desired device. The selected power output may be different based on the desired device implementing the selected circuit design. For example, certain devices may have larger batteries and, thus, may be able to withstand higher static power drain without adversely affecting battery life. In the embodiment of testing data shown in FIG. 3, initial bin voltage 402 is set at about 975 mV.

After assigning the initial bin operating voltage in 204, a curve may be fit to the testing data (e.g., data 400 in FIG. 3) in "Curve fit" 206, as shown in FIG. 2. In certain embodiments, the curve is fit to the testing data using the assigned initial bin voltage as a maximum operating voltage allowed for the curve. For example, as shown in FIG. 3, curve 404 is fit to data 400 with initial bin voltage 402 as the maximum operating voltage for the curve. Thus, curve 404 is fit to intercept a horizontal line representing initial bin voltage 402 at some point within the population of data 400. In some embodiments, the horizontal line representing initial bin voltage 402 becomes part of curve 404. Curve 404 may be fit using standard curve fitting operations (e.g., curve fitting algorithms or curve fitting software) known in the art. In some embodiments, curve 404 is fit using an exponential curve fitting operation. It is to be understood that curve 404 is not limited to an exponential curve fit or any typical curvature shape and that the curve may have any shape possible depending on the testing data population. For example, curve 404 may include one or more additional horizontal portions other than the horizontal line portion representing the initial bin voltage.

After fitting the curve in 206, an equation may be generated to describe the curve (e.g., curve 404 in FIG. 3) in "Generate equation" 208, as shown in FIG. 2. In certain embodiments, one equation is generated that describes both the horizontal line representing the initial bin voltage (e.g., initial bin voltage 402 in FIG. 3) and the curve fitting the data (e.g., curve 404 in FIG. 3). In some embodiments, more than one equation is generated to describe the curve. For example, one equation may describe the initial bin voltage while a second equation describes the curve.

In some embodiments, the equation is generated from curve fit data (e.g., the equation is fit to data that represents curve 404 and/or the horizontal line representing initial bin voltage 402, shown in FIG. 3). In certain embodiments, the equation describing the curve is generated during fitting of the curve. For example, an equation may be generated while fitting curve 404 to the testing data with initial bin voltage 402 set as the maximum voltage for the equation. The equation generated to describe curve 404 may be used later during testing and operation of an integrated circuit.

As shown in FIG. 3, curve 404, and the equation generated from the curve, is an upper boundary for a "bin" of integrated circuits. Thus, integrated circuits that have an operating voltage versus leakage current data point above curve 404 are considered to "fail" (e.g., static power consumption is too high) while integrated circuits that have an operating voltage versus leakage current data point below curve 404 are considered to "pass" (e.g., static power consumption is at an acceptable level).

Unlike rectangular bins, which are commonly used for binning integrated circuits, a bin created using curve 404 better represents the distribution in the testing data population. Creating the bin using curve 404 generates a bin that does not have a fixed voltage, unlike a rectangular bin, which has a fixed voltage based on the upper voltage limit of the bin. The bin using curve 404 has a voltage that varies with leakage current as described by the equation generated to describe the curve. Thus, the bin using curve 404, as shown in FIG. 3, has voltage values that decrease with increasing leakage current above a leakage current of about 18 mA.

Using curve 404 and the equation describing the curve to define the bin provides more accurate representation of the testing data population and may allow fewer bins to be used to cover the testing data population. Reducing the number of bins used to cover the testing data population may reduce test time while maintaining yield and average power for a batch of integrated circuits tested using the bins. In some embodiments, it may be possible to use only one bin to accurately describe the testing data population because of the variable voltage within the bin. In addition, having bins with variable voltage within the bin allows integrated circuits that are tested and binned using such bins to be operated at individual operating voltages defined by the equation describing the curve.

With rectangular bins, some later tested integrated circuits that are potentially acceptable can be failed because the square corners of the rectangular bins create "failure pockets" where acceptable power drain levels actually exist. Because curve 404 is fit to represent the population data, however, the bin created by the curve identifies integrated circuits in these pockets as acceptable integrated circuits. Additionally, rectangular bins have a tendency to capture (e.g., pass) integrated circuits that have test data that lie generally away from the actual testing data population. Though these integrated circuits are passed, these integrated circuits are generally unacceptable and prone to problems because they have operating characteristics that are largely different from the general population. Because curve 404 creates a bin that better represents the testing data population, however, such integrated circuits are failed during testing using the bin created by the curve.

In certain embodiments, an upper limit (shown by line 406 in FIG. 3) is also placed on the leakage current. The leakage current upper limit may be set, for example, to avoid leakage currents at unacceptable levels regardless of operating voltage. Thus, any integrated circuit with a leakage current above the upper limit line 406 will fail regardless of its operating voltage at that leakage current. The leakage current upper limit may be assigned at any point during process 200, shown in FIG. 2.

In some embodiments, more than one bin is assigned to the testing data obtained in 202, shown in FIG. 2. For example, more than one bin is used if integrated circuits using the selected circuit design can be used at more than one power drain level (e.g., more than one static power drain value). The selected circuit design may be useable at more than one power drain level if, for example, more than one product will use the integrated circuits with the selected circuit design. Assigning more bins to the testing data may produce better average power and higher yield. Typically, each additional bin is assigned at a different voltage so that there are multiple "voltage bins".

If more than one bin is to be created and assigned to the testing data, "Assign bin voltage" 204, "Curve fit" 206, and "Generate equation" 208 are repeated for each additional bin. As shown in FIG. 2, after the equation is generated in 208, "Additional bin" 210 poses the question of whether an additional bin is to be created and assigned to the testing data. If "Y", the process returns to "Assign bin voltage" 204 and the process is carried out for the additional bin. If "N", the process of assigning bins is completed.

The embodiments shown in FIG. 3 depicts two additional bins created and assigned to data 400. Initial bin voltage 408 at about 940 mV is used to fit curve 410 to data 400 and generate an equation describing the curve. Initial bin voltage 412 at about 900 mV is used to fit curve 414 to data 400 and generate an equation describing the curve. Thus, as shown in FIG. 3, three bins are created and assigned to data 400. A first bin is located below curve 404 and above curve 410; a second bin is located below curve 410 and above curve 414; and a third bin is located below curve 414. Using curve fitting (e.g., curves 404, 410, and 414) to define the bins provides more uniform power consumption within each bin because the bins have voltages that vary with leakage current. Thus, using the bins defined by the curves may provide better average power and better yield within each bin.

Figure 4:
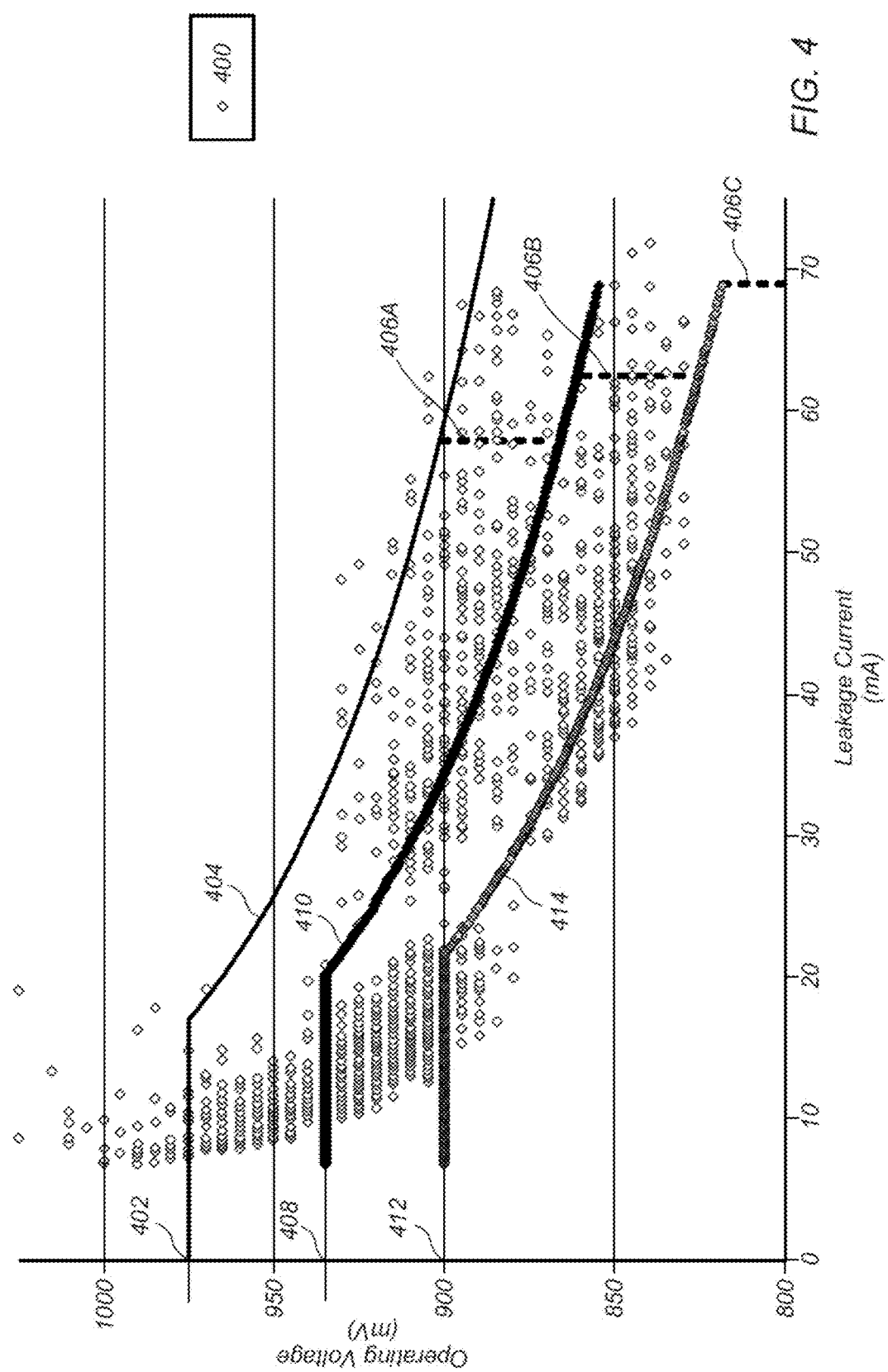
FIG. 4 depicts the plot of population testing data in FIG. 3 with different bins having different leakage current upper limits.

As shown in FIG. 3, all three bins share a common leakage current upper limit, shown by line 406. In some embodiments, each bin has a different leakage current upper limit. FIG. 4 depicts the plot of population testing data with the bins created and assigned in FIG. 3 with each bin having a different leakage current upper limit. Line 406A provides the leakage current upper limit for the bin located below curve 404 and above curve 410. Line 406B provides the leakage current upper limit for the bin located below curve 410 and above curve 414. Line 406C provides the leakage current upper limit for the bin located below curve 414. The different leakage current upper limits may be set at different values for each bin to improve average power for integrated circuits tested using the bins.

Figures 5, 6:
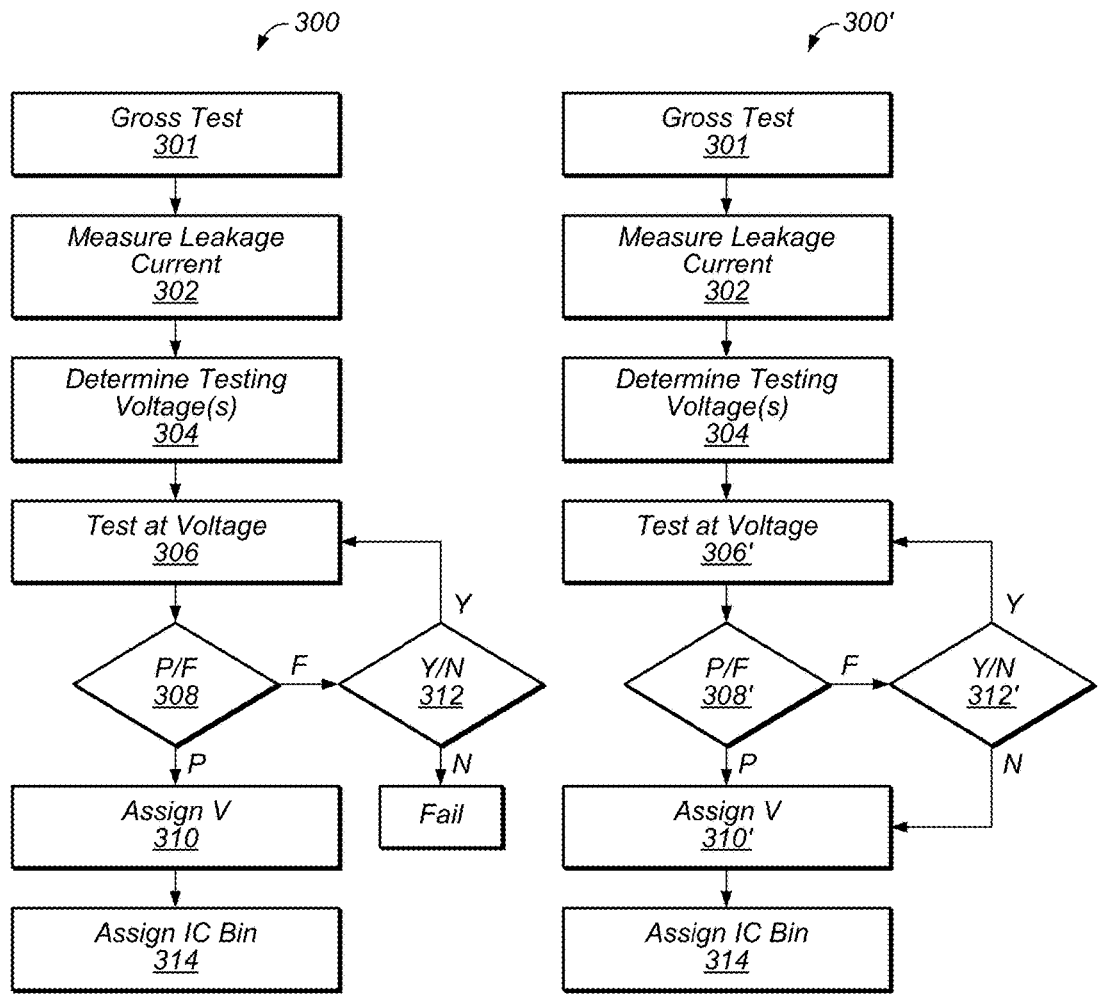
FIG. 5 depicts a flowchart of an embodiment of a binning process for binning integrated circuits.
FIG. 6 depicts a flowchart of an alternative embodiment of a binning process for binning integrated circuits.

After one or more bins are created and assigned using process 200, shown in FIG. 2, the bins may be used for binning of one or more integrated circuits (e.g., testing and assigning the integrated circuits to one of the bins created). FIGS. 5 and 6 depict flowcharts of embodiments of binning process 300 and binning process 300' for binning integrated circuits with the bins created by process 200. The integrated circuits binned in process 300 or process 300' may have the same circuit design (e.g., the selected circuit design) or a substantially similar circuit design to the test integrated circuits used to create the bins in process 200.

Process 300 and process 300' may begin with testing for gross functionality of the integrated circuit at "Gross Test" 301. For example, open/short testing and/or scan testing for hard defects may be done at "Gross Test" 301. If the integrated circuit fails one of the gross functionality tests, the part may not proceed through any further testing and may be thrown away.

After gross functionality testing, process 300 and process 300' may continue with measuring the leakage current of an integrated circuit in "Measure leakage current" 302. In some embodiments, the leakage current may be measured at the highest operating voltage allowed for the selected circuit design. The leakage current may, however, be measure at any selected operating voltage (e.g., at any desired set value of the operating voltage). It is to be understood that process 300 may be used on a plurality of integrated circuits with each integrated circuit being processed through process 300. Thus, when more than one integrated circuit is binned using process 300, typically the leakage current is measured at the same selected operating voltage for each integrated circuit.

If the measured leakage current is above one or more of the leakage current upper limits (e.g., line 406 shown in FIG. 3 or lines 406A, 406B, 406C shown in FIG. 4), then the integrated circuit may not be tested at one or all of the operating voltages (e.g., the integrated circuit fails at an operating voltage if the measured leakage current is above the leakage current upper limit for the corresponding curve).

The measured leakage current for the integrated circuit may be used to determine the operating voltages at which the integrated circuit is to be tested in "Determine testing voltage(s)" 304. An operating voltage is determined from the equation describing the curve for each bin created during process 200. The number of voltages to be tested corresponds to the number of bins created during process 200. For example, if only one bin is created, then the integrated circuit may only be tested at one operating voltage determined by the curve fitted for the one bin and the integrated circuit is passed or failed based on only the one tested operating voltage. As another example, the embodiment shown in FIG. 3 has three bins and, thus, the integrated circuit may be tested at three different operating voltages determined by the curve fitted for each bin.

To determine the operating voltage in 304, the measured leakage current found in 302 is plugged into the equation for each curve created during process 200 (e.g, the intersection of the measured leakage current with each curve is found). For example, using the three bins represented by the fitted curves shown in FIG. 3, a measured leakage current of about 40 mA would provide three operating voltages for testing the integrated circuit: (a) about 920 mV from curve 404; (b) about 880 mV from curve 410; and (c) about 860 mV from curve 414. Each testing operating voltage corresponds to an intersection of the measured leakage current with each curve fitted to the testing data population. For example, 920 mV corresponds to the intersection of 40 mA with curve 404 in FIG. 3.

After determining the testing operating voltages in 304, the integrated circuit is tested at one of the testing operating voltages in "Test at voltage" 306, shown in FIG. 5, or "Test at voltage" 306', shown in FIG. 6. Testing the integrated circuit may include, but not be limited to, assessing one or more operating parameters of the integrated circuit at the tested operating voltage and passing or failing the integrated circuit based on the assessment of the operating parameters. FIG. 5 depicts a flowchart of an embodiment of binning process 300 for binning integrated circuits starting with the lowest testing operating voltage first. FIG. 6 depicts a flowchart of an alternative embodiment of binning process 300' for binning integrated circuits starting with the highest testing operating voltage first.

In process 300, shown in FIG. 5, at 306 testing begins with the lowest testing operating voltage determined in 304. At "P/F" 308, the integrated circuit is either passed or failed at the tested operating voltage. If the integrated circuit passes "P", the integrated circuit is assigned a maximum operating voltage corresponding to the test voltage at "Assign V" 310. If the integrated circuit fails "F", then the question is posed if there is another operating voltage for testing at "Y/N" 312. If "Y", then the integrated circuit is tested at another (higher) testing operating voltage in 306. If "N", then the integrated circuit is failed.

If the integrated circuit passes the test at the lowest tested operating voltage when the integrated circuit is tested at the lowest tested operating voltage first, the integrated circuit may not need to be tested at any other operating voltage because typically, it is desirable to run the integrated circuit at the lowest possible operating voltage. In addition, testing at fewer operating voltages reduces testing time. As an example, using the measured leakage current of 40 mA provided above, the integrated circuit may be tested at 860 mV first, and if the integrated circuit passes the test at that voltage, it would not be tested at either 880 mV or 920 mV. If the integrated circuit, however, failed the test at 860 mV, the integrated circuit would then be tested at 880 mV and then, if necessary, at 920 mV. As shown above, if the integrated circuit fails at all three voltages 860 mV, 880 mV, and 920 mV, then the integrated circuit is failed at 312 and is removed.

In process 300', shown in FIG. 6, at 306' testing begins with the highest testing operating voltage determined in 304. At "P/F" 308', if the integrated circuit passes "P", then the question is posed if there is another operating voltage for testing at "Y/N" 312'. If "Y", then the integrated circuit is tested at another (lower) testing operating voltage in 306'. If "N", then the integrated circuit is assigned the last testing operating voltage at "Assign V" 310'.

If the integrated circuit fails "F" at "P/F" 308' but has previously passed one or more tests at higher voltages, the integrated circuit is assigned the lowest passed testing operating voltage at "Assign V" 310'. In certain embodiments, if the integrated circuit fails its first test (e.g., the test at the highest voltage) at "P/F" 308', the integrated circuit is failed immediately (e.g., the integrated circuit is thrown out). Throwing away the failed integrated circuit after the first test reduces testing time as the integrated circuit is likely to fail the test at lower testing voltages. In some embodiments, if the integrated circuit fails its first test, the integrated circuit is retested at "Test at voltage" 306' beginning at the next highest voltage determined in 304. The integrated circuit may be retested at successive lower voltages until a highest passing test voltage is found. In some embodiments, if the integrated circuit fails its first test, the integrated circuit is tested using another binning process such as process 300, depicted in FIG. 5.

As an example of binning process 300', shown in FIG. 6, with the measured leakage current of 40 mA described above, the integrated circuit may be tested at 920 mV first. If the integrated circuit fails the test at 920 mV, the integrated circuit would be removed (thrown away). If the integrated circuit passes the test at 920 mV, it would then be tested at 880 mV. If the integrated circuit failed the test at 880 mV, the integrated circuit would then be assigned an operating voltage of 920 mV. If the integrated circuit passed the test at 880 mV, then the integrated circuit would be tested at 860 mV. If the integrated circuit failed the test at 860 mV, the integrated circuit would then be assigned an operating voltage of 880 mV. If the integrated circuit passed the test at 860 mV, then the integrated circuit would assigned an operating voltage of 860 mV (the last testing voltage).

In some embodiments, if process 300 (depicted in FIG. 5) or process 300' (depicted in FIG. 6) includes testing one or more integrated circuits for more than one bin, each integrated circuit may be assigned to a bin, at "Assign IC bin" 314, based on the lowest operating voltage at which that integrated circuit passed the test. The bins may, for example, be defined by curves 404, 410, and 414, as described above and shown in FIG. 3. Assigning each integrated circuit to a specific bin may allow each integrated circuit to be designated for a specific type of product or a specific type of use based on, for example, the average properties (e.g., power) of that bin.

At 310, an integrated circuit is assigned a maximum operating voltage that corresponds to the lowest operating voltage at which the integrated circuit passed the test. In certain embodiments, the integrated circuit is programmed with the maximum operating voltage based on the equation describing the curve for the lowest operating voltage at which the integrated circuit passed the test. For example, an integrated circuit such as integrated circuit 102 (shown in FIG. 1) may have a measured leakage current of about 40 mA at a selected operating voltage. Using the measured leakage current of 40 mA, the integrated circuit may be tested at operating voltages of 860 mV, 880 mV, and 920 mV using process 300, depicted in FIG. 5. If the integrated circuit fails the tests at 860 mV and 880 mV but passes the test at 920 mV, then the integrated circuit may be programmed with the equation that describes curve 404 (which provided the tested operating voltage of 920 mV).

In some embodiments, the equation describing the curve is programmed into the logic of the integrated circuit. In some embodiments, the equation describing the curve is programmed into a fuse block containing one or more fuses in the integrated circuit (e.g., fuse block 106, shown in FIG. 1). In certain embodiments, the measured leakage current is also programmed into the integrated circuit. The measured leakage current may be fused into the integrated circuit using, for example, fuse block 106, shown in FIG. 1.

With the equation describing the curve and the measured leakage current programmed into the integrated circuit (e.g, integrated circuit 102), device 100 may operate at an operating voltage determined using the equations and the measured leakage current. For example, with the leakage current fused into integrated circuit 102, the operating voltage for the integrated circuit may be determined using the equation describing the curve programmed into the integrated circuit (e.g., the integrated circuit calculates its operating voltage based on the fused leakage current value from the programmed equation). Thus, integrated circuit 102 may operate at the determined operating voltage, which is provided by power supply 104. In some embodiments, the programmed equations and the fused leakage current value are used to determine the frequency of the integrated circuit in addition to the operating voltage.

Programming the equations found from curve fitting of the testing data population into one or more integrated circuits and providing leakage current values into such integrated circuits (e.g., through fuse block 106) allows each integrated circuit to determine its own operating voltage within its assigned bin. Allowing each integrated circuit to determine its own operating voltage provides better average power and more efficient operating parameters for each bin as compared to rectangular binning, in which each integrated circuit in a bin is assigned the same operating voltage.

The embodiment of the curve fitting and binning process described in FIGS. 2-6 provides curve fitting and binning for operating voltage versus leakage current data at a selected frequency. For example, testing data, such as shown in FIG. 3, may be acquired at a single operating frequency or in a small, limited frequency range. Thus, an integrated circuit programmed with an equation found from such curve fitting and binning is operable only at the single operating frequency or in the small, limited frequency range. To allow operation of an integrated circuit at a wider range of frequencies, data for the curve fitting and binning may be expanded to include operating points for integrated circuits in terms of operating frequency in addition to operating voltage and leakage current (e.g., the data includes the third element of operating frequency to provide three-dimensional data of operating voltage and operating frequency versus leakage current).

Figure 7:
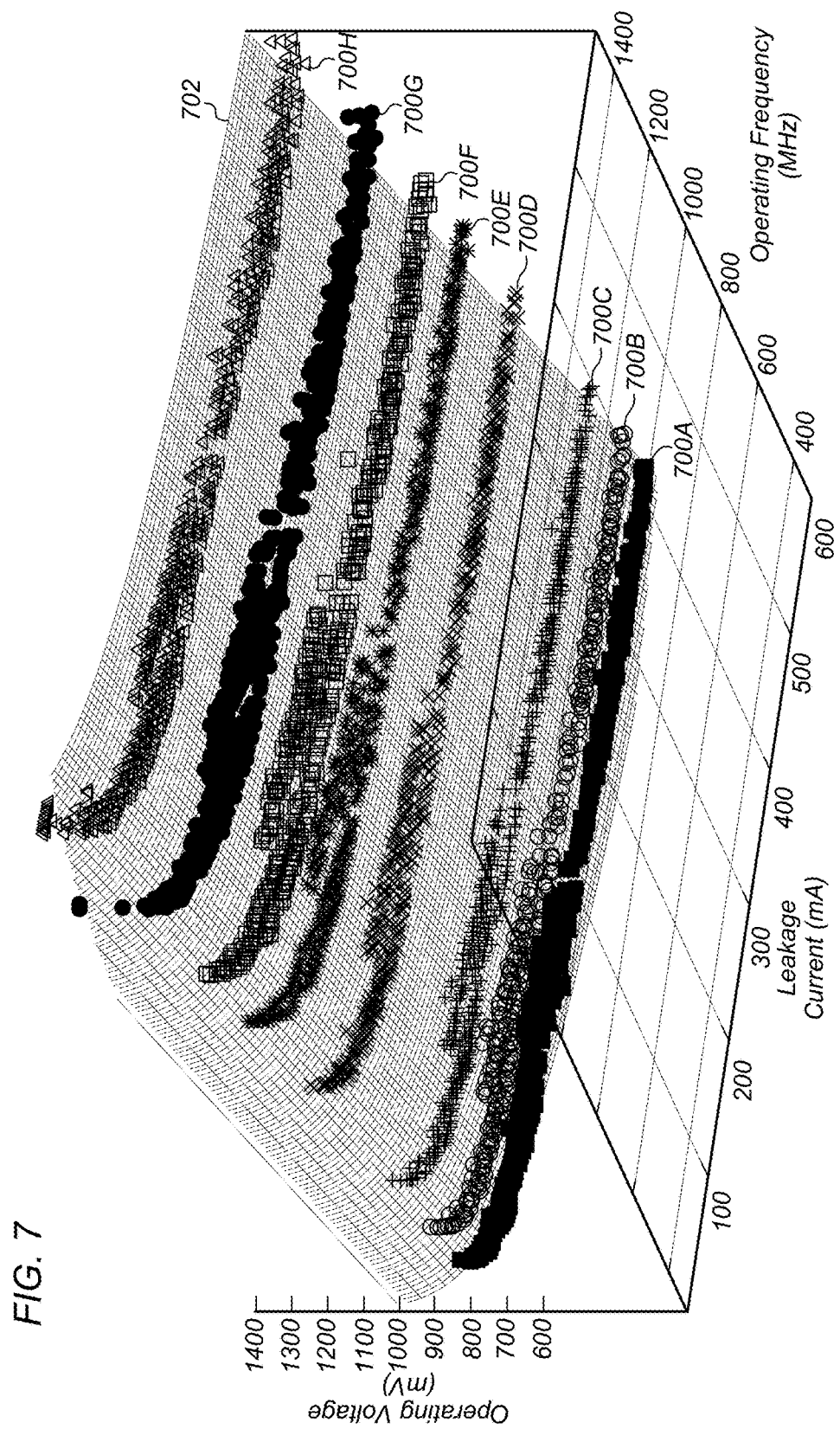
FIG. 7 depicts an embodiment of a plot of population testing data with operating voltage and operating frequency versus leakage current.

FIG. 7 depicts an embodiment of a plot of population testing data with operating voltage and operating frequency versus leakage current. Testing data 700 may be obtained by measuring leakage currents at a plurality of operating voltages and operating frequencies to produce a population of testing data for a selected circuit design. In certain embodiments, testing data is obtained by selecting an operating frequency and then measuring leakage currents at a plurality of operating voltages. For example, as shown in FIG. 7, leakage currents were measured at a plurality of operating voltages at 8 different operating frequencies (testing data 700A-H). Thus, testing data 700A is leakage current versus operating voltage data obtained at a first operating frequency while testing data 700H is leakage current versus operating voltage data at an eighth operating frequency with other testing data 700B-700G being leakage current versus operating voltage data at frequencies between the first and eighth operating frequencies.

As shown in FIG. 7, surface 702 may be fit to testing data 700. Surface 702 may be described by a surface equation (e.g., a three-dimensional equation used to describe a surface). Surface 702 may be fit using standard surface (curve) fitting operations for three-dimensional plots (e.g., surface fitting algorithms or surface fitting software for three-dimensional plots) known in the art. The surface equation fit to testing data 700 that defines surface 702 may define an operating surface for one or more integrated circuits that use the selected circuit design. In some embodiments, surface 702 is fit to testing data 700 and then a surface equation is generated to describe the surface. In some embodiments, the surface equation is generated during fitting of surface 702 to testing data 700. In some embodiments, surface 702 is described by more than one surface equation.

Figure 8:
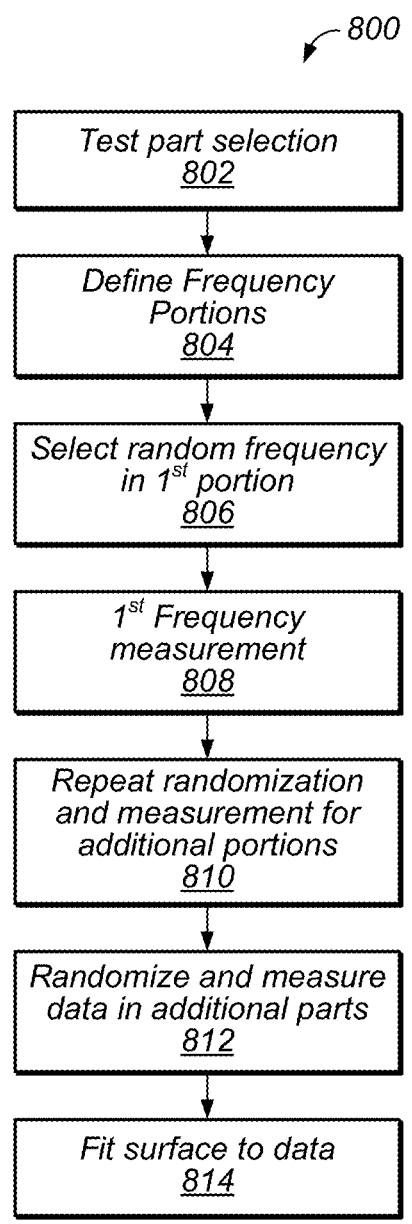
FIG. 8 depicts a flowchart of an embodiment for obtaining population testing data for operating voltage and operating frequency versus leakage current.

FIG. 8 depicts a flowchart of an embodiment for obtaining population testing data for operating voltage and operating frequency versus leakage current. Process 800 may begin with "Test part selection" 802. In 802, one or more integrated circuits are selected for testing a selected circuit design. In certain embodiments, the integrated circuits may be selected from "corner lots" made with the selected circuit design. Corner lots may be, for example, integrated circuits made on wafers that are processed at the extreme edges of the process parameters for the selected circuit design. Using integrated circuits from the corner lots may allow the tested integrated circuits to have a wide range of leakage currents (e.g., the tested circuits will cover the range of leakage currents that may be found during normal fabrication of the selected circuit design).

After selecting the test parts in 802, an operating frequency range for the selected circuit design may be divided into two or more portions in "Define frequency portions" 804. In 804, the operating frequency range for the selected circuit design is divided into portions that may be substantially equal portions (e.g., each portion comprises substantially the same size frequency range). For example, in one embodiment, the operating frequency range may be divided into 8 substantially equal frequency portions. As an example, the frequency portions may each be about 200 MHz to about 400 MHz in size.

After dividing the operating frequency range into portions in 804, a first testing operating frequency for a first test part (e.g., a first test integrated circuit) may be randomly selected in "Select random frequency in $1^{st}$ portion" 806. The first testing operating frequency may be selected from a first operating frequency portion (e.g., a lowest frequency range). The first testing operating frequency may be randomized using any random number generator (e.g., a computer operated random number generator) to select a randomly selected operating frequency in the first operating frequency portion.

Following selection of randomly selected operating frequency in 806, leakage current and operating voltage measurements for the first test integrated circuit may be taken at the first testing operating frequency in "$1^{st}$ Frequency measurement" 808. After the measurement of leakage current and operating voltage at the first test operating frequency has been taken, steps 806 and 808 may be repeated for each additional operating frequency portion in "Repeat randomization and measurement for additional portions" 810. Thus, a leakage current and operating voltage measurement for the first test integrated circuit is taken at a randomly selected testing operating frequency in each of the frequency portions defined in 804. For example, if the operating frequency range is divided into 8 portions in 804, the leakage current and operating voltage for the first test integrated circuit will be measured at 8 randomly selected operating frequencies with each randomly selected operating frequency lying within a different portion of the operating frequency range.

In "Randomize and measure data in additional parts" 812, steps 806 and 808 are repeated for additional test integrated circuits (e.g., additional test integrated circuits from one or more corner lots). Each additional test integrated circuit may be measured (e.g., have the leakage current and operating voltage measured) at different randomly selected frequencies in each frequency portion. Thus, for process 800 with the operating frequency range divided into 8 frequency portions at 804, each additional test integrated circuit will have its leakage current and operating voltage measured in each of the 8 frequency portions with each test integrated circuit having a different randomly selected operating frequency within each of the 8 frequency portions.

After measurement of all the additional test integrated circuits is completed in 812, at least one operating surface equation may be fit to the data in "Fit surface to data 814". As described above, the operating surface equation may be generated to describe a surface that fits the testing data (e.g., a surface similar to surface 702, shown in FIG. 7). The operating surface equation that fits the testing data may define an operating point for an integrated circuit with the selected circuit design as a function of operating voltage, operating frequency, and leakage current.

The use of integrated circuits from corner lots in combination with process 800, shown in FIG. 8, allows testing of a relatively small number of integrated circuit parts to produce a wide range of data sufficient to generate an operating surface equation for integrated circuits using the selected circuit design. For example, testing of approximately 100,000 parts at 8 different frequencies for each part provides 800,000 data points for operating frequency and operating voltage versus leakage current.

Figure 9:
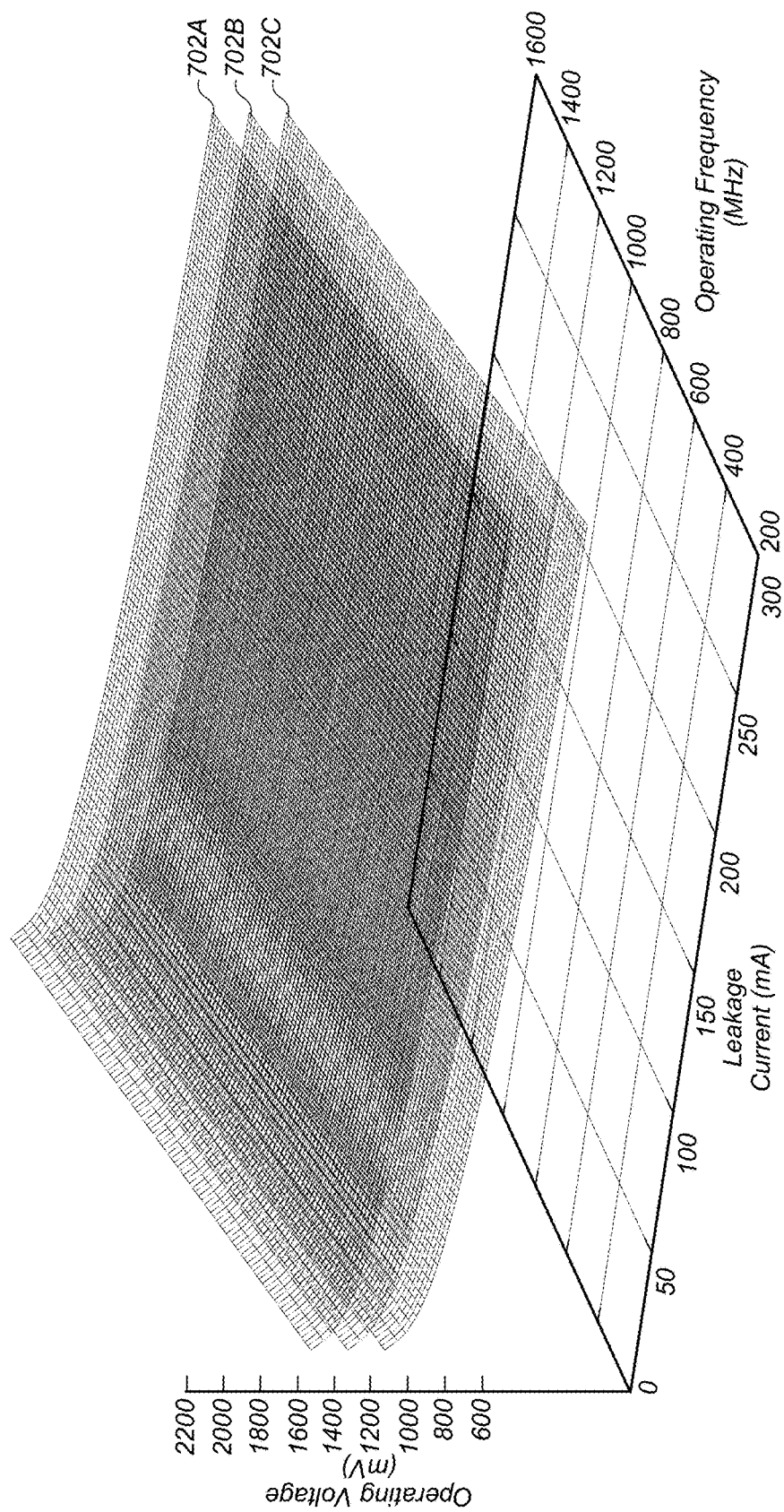
FIG. 9 depicts an embodiment of a plot of testing data with multiple operating surfaces dissecting the population for the testing data.

In some embodiments, multiple operating surface equations are generated for the testing data. For example, multiple operating surface equations may be generated when fabricated integrated circuits are to be binned using the testing data. Each operating surface equation may define a different operating surface that dissects the population for the testing data. FIG. 9 depicts an embodiment of a plot of testing data with multiple operating surfaces dissecting the population for the testing data. As shown in FIG. 9, three operating surfaces 702A, 702B, 702C are defined with each operating surface dissecting a portion of the testing data population. The operating surfaces 702A, 702B, 702C may define different bins for binning of integrated circuits. The number and/or position of the operating surfaces may be varied based on desired binning parameters and/or variations (e.g., statistical spread) in the testing data population.

Figure 10:
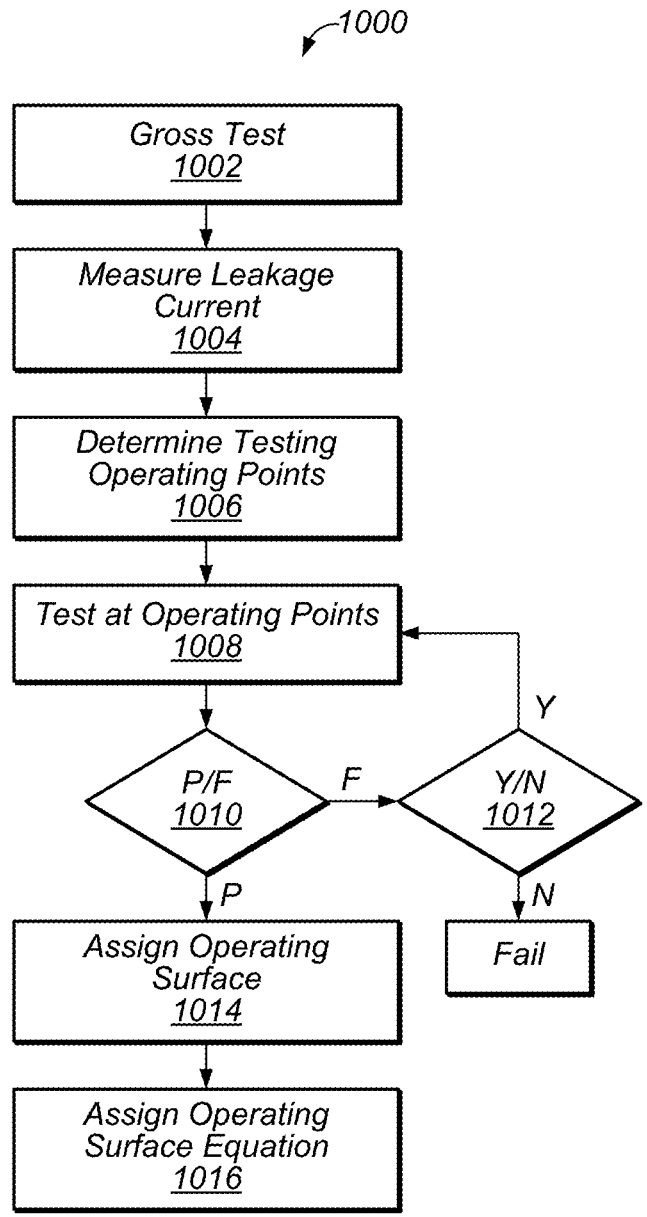
FIG. 10 depicts a flowchart of an embodiment of a binning process for binning integrated circuits with operating surfaces.

In certain embodiments, integrated circuits are binned using data and operating surfaces acquired from process 800, shown in FIG. 8, (or another testing process for accumulating operating frequency and operating voltage versus leakage current data and fitting one or more operating surfaces to the data). Binning of the integrated circuits may be done using a single bin (or operating surface), as shown in FIG. 7, or using multiple bins (operating surfaces), as shown in FIG. 9. FIG. 10 depicts a flowchart of an embodiment of binning process 1000 for binning integrated circuits with the bins (operating surfaces) created by process 800. The integrated circuits binned in process 1000 may have the same circuit design (e.g., the selected circuit design) or a substantially similar circuit design to the integrated circuits tested to create the operatings surfaces shown in FIGS. 7 and 9 (e.g., process 800 shown in FIG. 8).

Process 1000 may begin with testing for gross functionality of the integrated circuit at "Gross Test" 1002. For example, open/short testing and/or scan testing for hard defects may be done at "Gross Test" 1002. If the integrated circuit fails one of the gross functionality tests, the part may not proceed through any further testing and may be thrown away.

After gross functionality testing, process 1000 may continue with measuring the leakage current of an integrated circuit in "Measure leakage current" 1004. The leakage current may be measured at a selected operating voltage and a selected operating frequency. In some embodiments, the leakage current is measured at the highest operating voltage allowed for the selected circuit design and/or the highest operating frequency allowed for the selected circuit design. The leakage current may, however, be measure at any selected operating voltage (e.g., at any desired set value of the operating voltage) and/or any selected operating frequency (e.g., at any desired set value of the operating frequency). It is to be understood that process 1000 may be used on a plurality of integrated circuits with each integrated circuit being processed through process 1000. Thus, when more than one integrated circuit is binned using process 1000, typically the leakage current is measured at the same selected operating voltage and selected operating frequency for each integrated circuit. In some embodiments, if the measured leakage current is above an upper leakage current limit, then the integrated circuit may be failed and not undergo any further testing.

The measured leakage current for the integrated circuit may be used to determine the operating points (e.g., operating voltages and/or operating frequencies) at which the integrated circuit is to be tested in "Determine testing operating points" 1006. The operating points may be determined from the operating surface equations describing the operating surfaces for each bin created during process 800. Using an operating surface equation found during process 800, the measured leakage current from 1004 may be used to determine a curve along an operating surface (e.g., operating surface 702A, 702B, or 702C, shown in FIG. 9) that corresponds to the measured leakage current. One or more operating points may be selected along this curve on the operating surface at the measured leakage current to be used for testing the integrated circuit. The operating points may correspond to intersections of the measured leakage current with operating voltage and operating frequency along the operating surface defined by the operating surface equation. Thus, each operating point defines an operating voltage and operating frequency that lies along the operating surface and corresponds to the measured leakage current.

After determining the testing operating points in 1006, the integrated circuit may be tested at the operating points in "Test at operating points" 1008, as shown in FIG. 10. In 1008, the integrated circuit may be tested at one or more operating points along each operating surface to be tested (e.g., the integrated circuit may be tested at one or more operating points along each operating surface 702A, 702B, and/or 702C, shown in FIG. 9). In certain embodiments, the integrated circuit is tested at multiple operating points (e.g., 4-6 operating points) along an operating surface. Testing the integrated circuit at multiple operating points along the operating surface may provide increased accuracy in determining if the integrated circuit passes or fails testing for the bin defined by the operating surface.

In certain embodiments, as shown in FIG. 10, testing begins with the lowest operating surface (bin) (e.g., operating surface 702C is the lowest operating surface shown in FIG. 9). Beginning with the lowest operating surface allows for the fewest number of testing operations as the integrated circuit does not have to undergo further testing at higher operating surfaces if the integrated circuit passes testing at the lowest operating surface. At"P/F" 1010, the integrated circuit is either passed or failed at the tested operating surface. Passing or failure of the integrated circuit may be based on passing or failure of the integrated circuit on a selected percentage of the operating points along the tested operating surface. For example, if the integrated circuit is tested at 6 operating points along the tested operating surface, the integrated circuit may need to pass the test at 4 or more points to be considered as passing the test at the tested operating surface. The margin for testing along the tested operating surface may be determined based on, for example, statistical accuracy of the testing data and/or the operating surface equations used to define the operating surfaces.

If the integrated circuit passes "P", the integrated circuit is assigned to that operating surface at "Assign operating surface" 1014. If the integrated circuit fails "F", then the question is posed if there is another operating surface for testing at "Y/N" 1012. If "Y", then the integrated circuit is tested at one or more operating points along another (higher) operating surface in 1008. If "N", then the integrated circuit is failed.

In some embodiments, the integrated circuit is tested at the highest operating surface first (similar to testing at the highest operating voltage first, as shown in the embodiment of process 300' depicted in FIG. 6). When the integrated circuit is tested at the highest operating surface first, the integrated circuit may be assigned to the lowest operating surface at which the integrated surface passes testing after testing at each operating surface is completed. In some embodiments, if the integrated circuit fails testing the highest operatings surface, the integrated circuit is failed immediately and no further testing is done.

After the integrated circuit is assigned an operating surface at 1014, the integrated circuit is assigned an operating surface equation corresponding to the operating surface at "Assign operating surface equation" 1016. Thus, the integrated circuit is now assigned an operating surface equation that defines operating points for the integrated circuit as a function of operating voltage, operating frequency, and leakage current.

In certain embodiments, the operating surface equation assigned to the integrated circuit is programmed into the integrated circuit (e.g., programmed into the logic of the integrated circuit). For example, the operating surface equation may be programmed into a fuse block containing one or more fuses in the integrated circuit (e.g., fuse block 106, shown in FIG. 1). The measured leakage current of the integrated circuit may also be programmed into the integrated circuit (e.g., fused into the integrated circuit). In some embodiments, the operating surface equation found using process 800, shown in FIG. 8, (or another similar testing process for accumulating operating frequency and operating voltage versus leakage current data) is programmed into an integrated circuit fabricated with the selected circuit design without the integrated circuit going through a binning process such as process 1000, shown in FIG. 10.

In some embodiments, the operating surface equation and/or the measured leakage current are programmed into software executable by a processor (e.g., the device and/or the integrated circuit). In some embodiments, the operating surface equation is stored as program instructions in a computer readable storage medium (e.g., a non-transitory computer readable storage medium) and the operating surface equation is executable by the processor.

With the operating surface equation programmed into the integrated circuit (such as integrated circuit 102, shown in FIG. 1), device 100 may operate at an operating voltage determined, at a given operating frequency, using the operating surface equation and the leakage current programmed into the integrated circuit. For example, the given operating frequency may be selected or determined based on a desired operation of device 100 (e.g., the operating frequency may be given based on a certain operation of the device). The given operating frequency may then be input into the operating surface equation (e.g., the operating frequency may be given as an input to the logic of the integrated circuit). The operating surface equation may then determine an operating voltage for the integrated circuit using the given operating frequency and the fused leakage current value. The determined operating voltage value may then be provided to power supply 104, which is sets its output voltage to integrated circuit 102 at the determined operating voltage.

Having the operating surface equation and the leakage current programmed into the integrated circuit allows the operating voltage to be adjusted based on the desired or given operating frequency of the integrated circuit. For example, the operating point of the integrated circuit on its operating surface (defined by the operating surface equation) is adjusted based on the given operating frequency of the integrated circuit. Thus, the integrated circuit can traverse up and down an operating voltage versus operating frequency curve along the operating surface as defined by the fused leakage current with the traverse up and down the curve being determined using the operating surface equation.

In certain embodiments, with the operating surface equation programmed into the integrated circuit, the frequency of the integrated circuit may be varied within a specified frequency range (e.g., the integrated circuit is allowed to operate at any operating frequency within the specified frequency range). The operating voltage is then adjusted to compensate for changes in the frequency using the programmed operating surface equation and the fused leakage current (e.g., a new operating point along the operating voltage versus operating frequency curve is found using the programmed operating surface equation). Adjustment of the operating voltage in view of changes in the frequency helps manage thermal and performance levels and improves operation efficiency of the device.

In some embodiments, the specified frequency range is determined by the operating surface equation. For example, the specified frequency range may be programmed in as part of the operating surface equation. In certain embodiments, the operating frequency is continuously variable within the specified frequency range. For example, the operating frequency may be stepped (e.g., raised or lowered) any amount within the specified frequency range. Variation of the operating frequency allows the integrated circuit to be used for multiple programs without the need for re-characterization of the integrated circuit (e.g., there is no need for characterization of the integrated circuit at another operating frequency to switch programs as the operating surface equation programmed into the integrated circuit allows the operating frequency to be changed). Without the need for re-characterization, turnaround times for changing programs is reduced.

The ability to change operating frequencies also allows algorithms that involve thermal management and/or performance management to be fully implemented and achieve their maximum potential. Adjustment of the operating frequency within the specified frequency range provides fine grain control for both thermal management and performance management over a wide range of frequencies. The programmed operating surface equation allows large increases or decreases in operating frequency to be implemented as needed. For example, the programmed operating surface equation allows large steps downward in the operating frequency (in a controlled fashion) to reduce temperature in the device and provide thermal management of the device. Similarly, the programmed operating surface equation allows large steps upward in the operating frequency (in a controlled fashion) to increase performance in the device and provide performance control of the device.

In certain embodiments, the operating surface equation is adjusted based on one or more operating factors of the integrated circuit programmed with the operating surface equation. Adjustment of the operating surface equation may include adjustment of an operating surface described by the operating surface equation. For example, the operating surface may be adjusted to have a different slope relative to one axis of the operating surface, offset to a higher or lower plane (e.g., linearly offset), or tilted about a reference point along one axis of the operating surface. In certain embodiments, operating factors of the integrated circuit used to adjust the operating surface equation include, but are not limited to, an operating temperature of the integrated circuit, a number of active execution units in the integrated circuit, and an age of the integrated circuit.

In certain embodiments, operating temperature of the integrated circuit is used to adjust the operating surface equation. Operating temperature of the integrated circuit may be assessed (measured) using one or more temperature sensors located on the integrated circuit or a device (e.g., a semiconductor die) including the integrated circuit. The temperature sensor(s) may provide temperature data to the integrated circuit continuously or at selected times during operation of the integrated circuit. The response of the integrated circuit to temperature may be assessed by testing the integrated circuit (or a test integrated circuit with substantially similar design) at a variety of temperatures and generating temperature measurement data for the integrated circuit. In some embodiments, a simulation program may be used, alone or in combination with temperature measurement data, to define the temperature response of the operating surface equation.

The temperature response of the integrated circuit may be used to generate adjustments in the operating surface (as defined by the operating surface equation) based on operating temperature of the integrated circuit. For example, the temperature measurement data and/or temperature response simulation may be used to adjust the operating surface for different operating temperatures of the integrated circuit. Adjustment of the operating surface may be provided by adjusting one or more temperature parameters of the operating surface equation programmed into the integrated circuit. For example, one or more temperature parameters of the operating surface equation may be adjusted to fit the operating surface equation to a set of operating data for the integrated circuit at a specific temperature.

Figure 11:
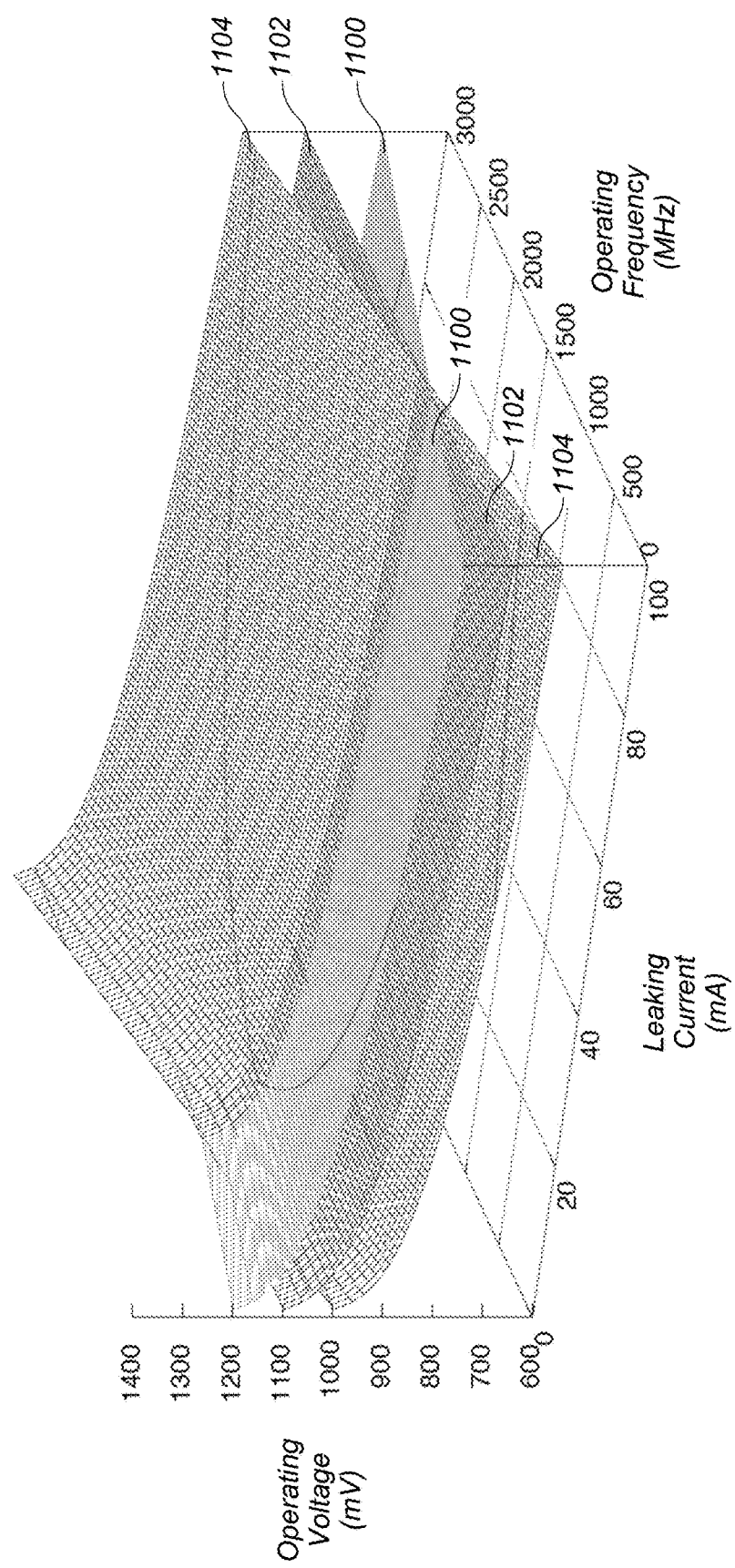
FIG. 11 depicts an example of embodiments of plots of adjusted operating surfaces for different operating temperatures of an integrated circuit.

FIG. 11 depicts an example of embodiments of plots of adjusted operating surfaces (as defined by the operating surface equation) for different operating temperatures of the integrated circuit. First operating surface 1100 may be for a first temperature, second operating surface 1102 may be for a second temperature, and third operating surface 1104 may be for a third temperature. For the example shown FIG. 11, the first temperature may be 0° C., the second temperature may be 25° C., and the third temperature may be 85° C. In certain embodiments, first operating surface 1100 may be a "base" operating surface (e.g., the first operating surface is the base or unadjusted operating surface defined for the integrated circuit) and second operating surface 1102 and third operating surface 1104 may be "adjusted" operating surfaces (e.g., the second and third operating surfaces are adjustments of the first operating surface, based on temperature, provided by adjusting one or more temperature parameters of the operating surface equation). The base and adjusted operating surfaces may be varied, however, as desired for operation of the integrated circuit (e.g., the second operating surface or the third operating surface may be the base operating surface with the other operating surfaces being the adjusted operating surfaces).

Each of operating surfaces 1100, 1102, and 1104 may be defined by the operating surface equation with the differences between the operating surfaces being in the adjustment of one or more temperature parameters in the operating surface equation, as described above. Thus, adjustment of the temperature parameters in the operating surface equation may be used to adjust the operating surface for different operating temperatures of the integrated circuit. The temperature adjustment parameters may be determined by adjusting the parameters until the operating surface equation fits each of first operating surface 1100, second operating surface 1102, and third operating surface 1104.

The temperature adjustment parameters to the operating surface equation may be programmed in the integrated circuit (e.g., programmed into the operating surface equation). Programming the temperature adjustment parameters into the integrated circuit allows the integrated circuit to automatically adjust its operation (e.g., operating voltage and/or operating frequency of the integrated circuit) based on detected changes in the operating temperature of the integrated circuit. For example, the operating voltage of the integrated circuit may be adjusted when the operating temperature of the integrated circuit changes from a current value (current or present temperature) to another temperature.

In some embodiments of integrated circuits, as shown in FIG. 11, the operating voltage at a particular operating frequency (e.g., a selected operating frequency) remains substantially constant with temperature (e.g., the operating voltage does not change with temperature at the selected frequency). In such embodiments, operating surfaces 1100, 1102, 1104 may be differentiated from each other by their rotation (e.g., tilting) about an axis defined by the selected operating frequency (e.g., the axis is a line along the selected operating frequency). For example, first operating surface 1100 has a different rotation about the axis at the selected operating frequency than second operating surface 1102 or third operating surface 1104. Thus, the operating surface of the integrated circuit "tilts" based on the operating temperature of the integrated circuit. These "tilts" may be defined by the adjustment of the one or more temperature adjustment parameters of the operating surface equation.

In some embodiments, because of the different tilts in the operating surfaces about the axis at the selected frequency for different temperatures, operating voltage may increase with increasing temperature at frequencies above the selected frequency and operating voltage may increase with decreasing temperature at frequencies below the selected frequency. For example, as shown in FIG. 11, the operating voltage on first operating surface 1100 is higher than the operating voltage on second operating surface 1102 at an operating frequency of about 500 MHz (above the selected frequency of about 1500 MHz) while the operating voltage on the second operating surface is higher than the operating voltage on the first operating surface at an operating frequency of about 2500 MHz.

In certain embodiments, a number of active execution units (cores) in the integrated circuit is used to adjust the operating surface equation. An "execution unit" as used herein may refer to any circuit within an integrated circuit that may be turned on or off during use of the integrated circuit. Execution units may include, for example, central processing units (CPUs) and/or graphical processing units (GPUs). Execution units may also include smaller subsets of CPUs or GPUs (e.g., a CPU may include multiple execution units). Turning on/off of the execution unit may be controlled using software or other logic programmed into the integrated circuit. Activity in the integrated circuit (the number of active execution units) may be assessed (e.g., measured or tracked) using software or hardware in the integrated circuit or a device associated with the integrated circuit.

The response of the integrated circuit to the number of active execution units may be assessed by testing the integrated circuit (or a test integrated circuit with substantially similar design) with a variety of different execution units turned on and/or off. In some embodiments, a simulation program may be used, alone or in combination with test data, to define the response of the operating surface equation to the number of active execution units. In some embodiments, different voltage drops are associated with different execution units. Thus, the operating surface equation may be tested based on which execution units or combination of execution units are active.

The activity response of the integrated circuit may be used to generate adjustments in the operating surface (as defined by the operating surface equation) based on number of active execution units in the integrated circuit. For example, the test data described above and/or simulation may be used to adjust the operating surface for different numbers of active execution units in the integrated circuit. Adjustment of the operating surface for activity may be provided by adjusting one or more activity parameters of the operating surface equation programmed into the integrated circuit. For example, one or more activity parameters of the operating surface equation may be adjusted to fit the operating surface equation to a set of operating data for the integrated circuit with a specific number of active execution units (or specific combination of active execution units).

Figure 12:
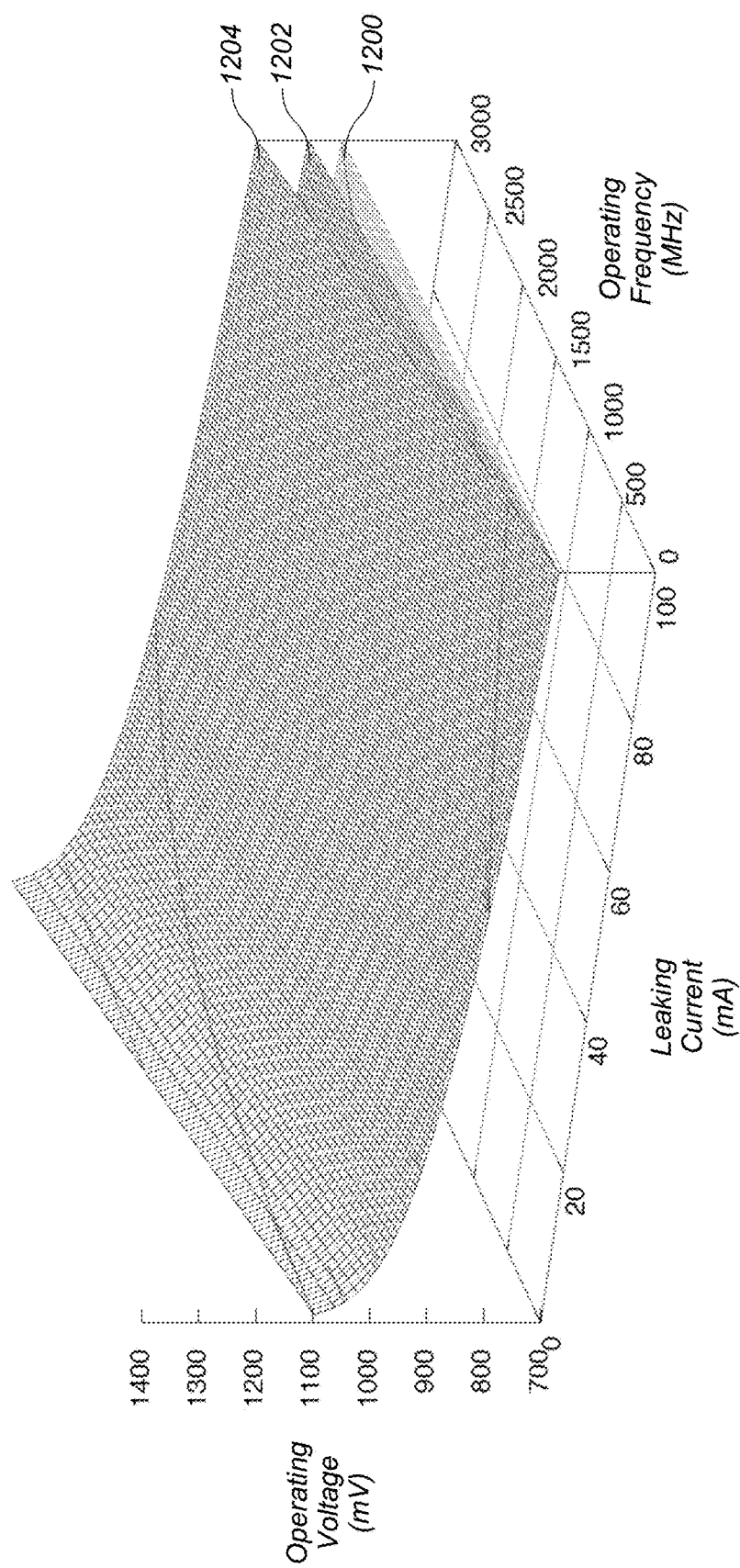
FIG. 12 depicts an example of embodiments of plots of adjusted operating surfaces for different numbers of active execution units in an integrated circuit.

FIG. 12 depicts an example of embodiments of plots of adjusted operating surfaces (as defined by the operating surface equation) for different numbers of active execution units in the integrated circuit. For example, as shown in FIG. 12, first operating surface 1200 is for one active execution unit, second operating surface 1202 is for two active execution units, and third operating surface 1204 is for four active execution units. In certain embodiments, one or more activity parameters of the operating surface equation are adjusted to define the differences between operating surfaces 1200, 1202, and 1204. Adjustment of the activity parameters in the operating surface equation may be used to adjust the operating surface for different numbers of active execution units in the integrated circuit. The activity adjustment parameters may be determined by adjusting the parameters until the operating surface equation fits each of first operating surface 1200, second operating surface 1202, and third operating surface 1204.

In some embodiment, operating surfaces 1200, 1202, and 1204 may have different slopes relative to the operating frequency of the integrated circuit. For example, as shown in FIG. 12, first operating surface 1200 has a smaller slope relative to the operating frequency than second operating surface 1202 and the second operating surface has a smaller slope relative to the operating frequency than third operating surface 1204. Thus, the activity adjustment parameter in the operating surface equation may be the slope of the operating surface relative to the operating frequency.

The activity adjustment parameters to the operating surface equation may be programmed in the integrated circuit (e.g., programmed into the operating surface equation). Programming the activity adjustment parameters into the integrated circuit allows the integrated circuit to automatically adjust its operation (e.g., operating voltage and/or operating frequency of the integrated circuit) based on detected changes in the number of active execution units of the integrated circuit. For example, the operating voltage of the integrated circuit may be adjusted when a current (present) number of active execution units in the integrated circuit changes to a different number of active execution units (e.g., from 2 to 4 active execution units or vice versa).

In certain embodiments, an age of the integrated circuit is used to adjust the operating surface equation. The response of the integrated circuit to the age of the integrated circuit may be assessed using aging models (simulation) and/or accelerated testing of the integrated circuit (e.g., testing at elevated temperatures to accelerate aging of the integrated circuit). The age response of the integrated circuit may be used to generate adjustments in the operating surface (as defined by the operating surface equation) based on the age of the integrated circuit. For example, the age response may be used to adjust the operating surface as the integrated circuit ages during use. The age of the integrated circuit may be assessed (e.g., measured or tracked) using circuits (e.g., hardware circuits such as ring oscillators) or software configured to track the integrated circuit age.

Figure 13:
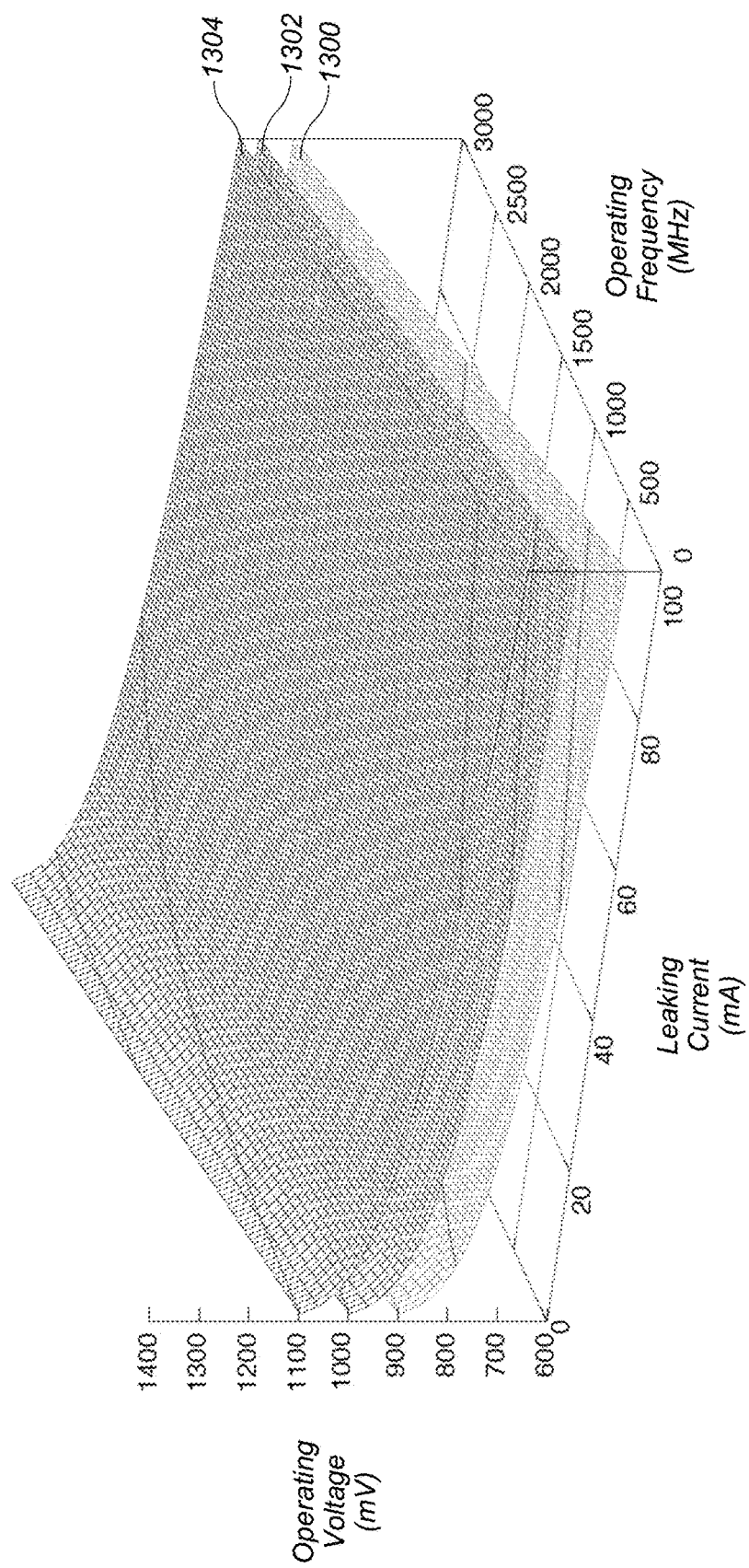
FIG. 13 depicts an example of embodiments of plots of adjusted operating surfaces for the age of an integrated circuit.

Adjustment of the operating surface based on the age of the integrated circuit may be provided by adjusting one or more age parameters of the operating surface equation programmed into the integrated circuit. In certain embodiments, the operating surface equation is adjusted using one or more age parameters when the age of the integrated circuit reaches a selected age (e.g., the age of the integrated circuit has a selected increase). FIG. 13 depicts an example of embodiments of plots of adjusted operating surfaces (as defined by the operating surface equation) for the age of the integrated circuit. For example, as shown in FIG. 13, first operating surface 1300 is for a newly operational (day 1) integrated circuit, second operating surface 1302 is for the integrated circuit after two years, and third operating surface 1304 is for the integrated circuit after 4 years. The age adjustment parameters may be determined by adjusting the parameters until the operating surface equation fits each of first operating surface 1300, second operating surface 1302, and third operating surface 1304.

In some embodiment, operating surfaces 1300, 1302, and 1304 are offset operating surfaces (e.g., the operating surfaces are offset on the operating voltage axis). For example, as shown in FIG. 13, second operating surface 1302 is offset above first operating surface 1300 and third operating surface 1304 is offset above the second operating surface. The operating voltage may increase by the offset as the integrated circuit ages (e.g., the plane of the operating surface may be offset to higher operating voltages as the integrated circuit ages). Thus, the age adjustment parameter in the operating surface equation may be the offset of the operating surface on the operating voltage axis.

In certain embodiments, the operating surface equation uses the age adjustment parameter to move (offset) the operating surface as the age of the integrated circuit increases (e.g., the operating voltage is adjusted when the integrated circuit reaches a selected age by adjusting the operating surface according to the selected age). The offset may be a selected amount for a selected increase in the age of the integrated circuit. For example, the operating surface may be adjusted to move from first operating surface 1300 to second operating surface 1302 after two years and then to third operating surface 1304 after four years. Unlike temperature adjustment and the activity adjustment of the operating surface equation, age adjustment may occur once after a selected amount of time (e.g., the operating surface equation adjusts for the age of the integrated circuit and does not return to previous parameters for younger ages of the integrated circuit).

In some embodiments, the operating surface is continuously adjusted as the age of the integrated circuit increases. For example, the offset of the operating surface may be continuously adjusted (moved) over time as the integrated circuit ages. The rate of change of the offset in the operating surface may be slow. Providing a slow rate of change in the offset may inhibit abrupt changes in the operating surface from causing problems in operation of the integrated circuit.

The age adjustment parameters to the operating surface equation may be programmed in the integrated circuit (e.g., programmed into the operating surface equation). Programming the age adjustment parameters into the integrated circuit allows the integrated circuit to automatically adjust its operation (e.g., operating voltage and/or operating frequency of the integrated circuit) based on detected changes in the age of the integrated circuit. For example, the operating voltage of the integrated circuit may be adjusted when a current (present) age of the integrated circuit changes to a different selected age (e.g., the operating voltage is adjusted when the integrated circuit reaches an age of two years).

As described above, the operating surface equation may be adjusted based on one or more parameters programmed into the operating surface equation. These parameters may be associated with different operating factors (e.g., temperature, activity, or age) of the integrated circuit. The operating surface equation may be adjusted based on one operating factor or a combination of operating factors depending on what operating factors changes are detected in the integrated circuit. For example, in one embodiment, only operating temperature may change and affect the operating surface equation while in another embodiment operating temperature, activity, and age may all change and combine to affect the operating surface equation.

Adjustment of the operating surface equation may adjust the operating surface for the integrated circuit and thus adjust operating points of the integrated circuit (e.g., operating voltage and/or operating frequency). The adjusted operating point of the integrated circuit may be a function of the sum of operating factors. For example, an adjusted operating voltage may be a sum of the current (present or base) operating voltage plus any changes in the operating voltage due to changes in operating temperature, activity, and/or age of the integrated circuit. Adjustment of the operating voltage (and/or operating frequency) based on changes in these operating factors may optimize power utilization and processing capability of the integrated circuit. For example, the power utilization of the integrated circuit may be optimized to save power consumption based on the operating factors of the integrated circuit. Adjustment of the operating voltage based on changes in these operating factors may also increase the operational lifetime of the integrated circuit and a device operated by the integrated circuit.

In certain embodiments, one or more process steps described herein may be performed by one or more processors (e.g., a computer processor) executing instructions stored on a non-transitory computer-readable medium. For example, process 800 or process 1000, shown in FIGS. 8 and 10, respectively, may have one or more steps performed by one or more processors executing instructions stored as program instructions in a computer readable storage medium (e.g., a non-transitory computer readable storage medium).

Figure 14:
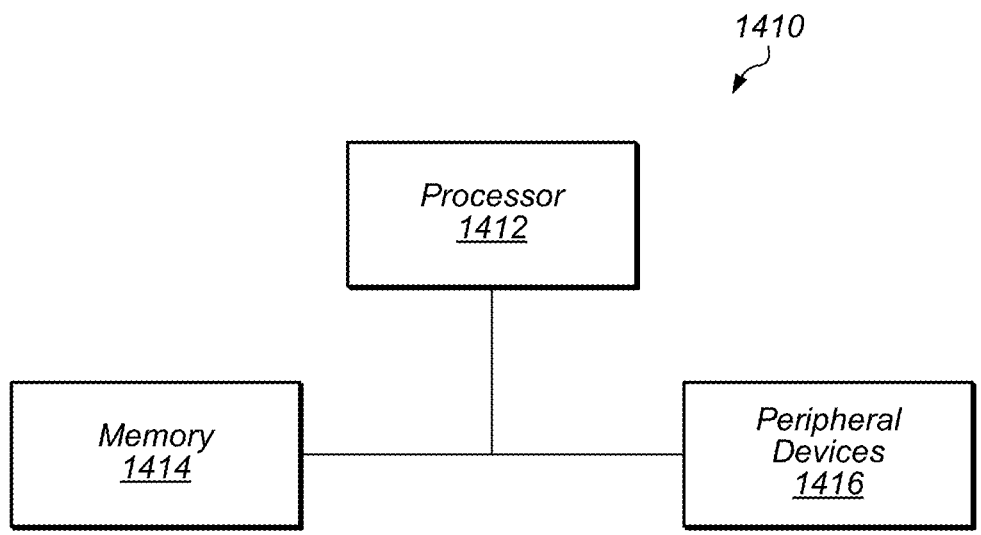
FIG. 14 depicts a block diagram of one embodiment of an exemplary computer system.

FIG. 14 depicts a block diagram of one embodiment of exemplary computer system 1410. Exemplary computer system 1410 may be used to implement one or more embodiments described herein. In some embodiments, computer system 1410 is operable by a user to implement one or more embodiments described herein such as process 1000, shown in FIG. 10. In the embodiment of FIG. 14, computer system 1410 includes processor 1412, memory 1414, and various peripheral devices 1416. Processor 1412 is coupled to memory 1414 and peripheral devices 1416. Processor 1412 is configured to execute instructions, including the instructions for process 1000, which may be in software. In various embodiments, processor 1412 may implement any desired instruction set (e.g. Intel Architecture-32 (IA-32, also known as x86), IA-32 with 64 bit extensions, x86-64, PowerPC, Sparc, MIPS, ARM, IA-64, etc.). In some embodiments, computer system 1410 may include more than one processor. Moreover, processor 1412 may include one or more processors or one or more processor cores.

Processor 1412 may be coupled to memory 1414 and peripheral devices 1416 in any desired fashion. For example, in some embodiments, processor 1412 may be coupled to memory 1414 and/or peripheral devices 1416 via various interconnect. Alternatively or in addition, one or more bridge chips may be used to coupled processor 1412, memory 1414, and peripheral devices 1416.

Memory 1414 may comprise any type of memory system. For example, memory 1414 may comprise DRAM, and more particularly double data rate (DDR) SDRAM, RDRAM, etc. A memory controller may be included to interface to memory 1414, and/or processor 1412 may include a memory controller. Memory 1414 may store the instructions to be executed by processor 1412 during use, data to be operated upon by the processor during use, etc.

Figure 15:
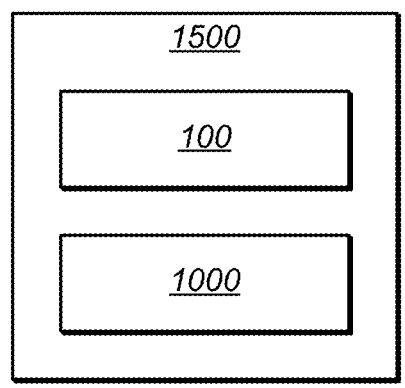
FIG. 15 depicts a block diagram of one embodiment of a computer accessible storage medium.

Peripheral devices 1416 may represent any sort of hardware devices that may be included in computer system 1410 or coupled thereto (e.g., storage devices, optionally including computer accessible storage medium 1500, shown in FIG. 15, other input/output (I/O) devices such as video hardware, audio hardware, user interface devices, networking hardware, etc.).

Turning now to FIG. 15, a block diagram of one embodiment of computer accessible storage medium 1500 including one or more data structures representative of device 100 (depicted in FIG. 1) included in an integrated circuit design and one or more code sequences representative of process 1000 (shown in FIG. 10). Each code sequence may include one or more instructions, which when executed by a processor in a computer, implement the operations described for the corresponding code sequence. Generally speaking, a computer accessible storage medium may include any storage media accessible by a computer during use to provide instructions and/or data to the computer. For example, a computer accessible storage medium may include non-transitory storage media such as magnetic or optical media, e.g., disk (fixed or removable), tape, CD-ROM, DVD-ROM, CD-R, CD-RW, DVD-R, DVD-RW, or Blu-Ray. Storage media may further include volatile or non-volatile memory media such as RAM (e.g. synchronous dynamic RAM (SDRAM), Rambus DRAM (RDRAM), static RAM (SRAM), etc.), ROM, or Flash memory. The storage media may be physically included within the computer to which the storage media provides instructions/data. Alternatively, the storage media may be connected to the computer. For example, the storage media may be connected to the computer over a network or wireless link, such as network attached storage. The storage media may be connected through a peripheral interface such as the Universal Serial Bus (USB). Generally, computer accessible storage medium 1500 may store data in a non-transitory manner, where non-transitory in this context may refer to not transmitting the instructions/data on a signal. For example, non-transitory storage may be volatile (and may lose the stored instructions/data in response to a power down) or non-volatile.

Further modifications and alternative embodiments of various aspects of the embodiments described in this disclosure will be apparent to those skilled in the art in view of this description. Accordingly, this description is to be construed as illustrative only and is for the purpose of teaching those skilled in the art the general manner of carrying out the embodiments. It is to be understood that the forms of the embodiments shown and described herein are to be taken as the presently preferred embodiments. Elements and materials may be substituted for those illustrated and described herein, parts and processes may be reversed, and certain features of the embodiments may be utilized independently, all as would be apparent to one skilled in the art after having the benefit of this description. Changes may be made in the elements described herein without departing from the spirit and scope of the following claims.

What is claimed is:

1. A device, comprising:
an integrated circuit programmed with an operating surface equation that defines an operating point as a function of operating voltage, operating frequency, leakage current, and at least one additional operating factor;
wherein an operating voltage of the integrated circuit at a given operating frequency is determined by the integrated circuit evaluating the operating surface equation at the given operating frequency, a current value of the at least one additional operating factor, and at least one leakage current value fused into the device, wherein the leakage current value is determined during a test of the integrated circuit; and
wherein the integrated circuit is programmed to adjust the operating voltage based on changes in the current value of the at least one operating factor.

2. The device of claim 1, wherein the operating surface equation is generated prior to manufacture of the integrated circuit by fitting a surface equation to operating voltage and operating frequency versus leakage current data for a plurality of test integrated circuits, the test integrated circuits comprising a substantially similar design to the integrated circuit.

3. The device of claim 1, wherein the at least one additional operating factor comprises an operating temperature of the integrated circuit, and the operating voltage increases with increasing temperature at operating frequencies above a first operating frequency, and the operating voltage increases with decreasing temperature at operating frequencies below the first operating frequency.

4. The device of claim 1, wherein the at least one additional operating factor comprises a number of active execution units of the integrated circuit, and the operating voltage is increased when the number of active execution units increases.

5. The device of claim 4, wherein an execution unit comprises a circuit that is turned on and off.

6. The device of claim 1, wherein the at least one additional operating factor comprises an age of the integrated circuit, and the operating voltage is increased as the age of the integrated circuit increases.

7. The device of claim 6, wherein the integrated circuit is programmed to increase the operating voltage a selected amount with a selected increase in the age of the integrated circuit.

8. A method, comprising:
measuring a leakage current of an integrated circuit at a selected operating voltage and a selected operating frequency;
incorporating a value of the measured leakage current into the integrated circuit; and
programming the integrated circuit with an operating surface equation that defines an operating point as a function of operating voltage, operating frequency, at least one additional operating factor, and leakage current;
determining an operating voltage of the integrated circuit at a given operating frequency by the integrated circuit evaluating the operating surface equation at the given operating frequency, a current value of the at least one additional operation factor, and the measured leakage current;
detecting a change in the current value of the at least one additional operating factor; and
adjusting the operating voltage based on the change.

9. The method of claim 8, wherein adjusting the operating voltage comprises reevaluating the operating surface equation at the given operating frequency, the measured leakage current, and the detected change in the current value of the at least one additional operating factor.

10. The method of claim 8, further comprising generating the operating surface equation by fitting at least one operating surface equation to operating voltage and operating frequency versus leakage current data for a plurality of test integrated circuits, the plurality of test integrated circuits being of substantially similar design to the integrated circuit.

11. The method of claim 8, further comprising allowing the integrated circuit to operate at any operating frequency within a specified operating frequency range, wherein the specified operating frequency range is determined by the operating surface equation.

12. The method of claim 8, wherein the at least one additional operating factor comprises a number of active execution units and the operating voltage increases when the number of active execution units increases.

13. The method of claim 8, wherein the at least one additional operating factor comprises an age of the integrated circuit and an operating surface defined by the operating surface equation is offset to a higher operating voltage as the age of the integrated circuit increases.

14. The method of claim 8, wherein the at least one additional operating factor comprises an operating temperature of the integrated circuit and an operating surface defined by the operating surface equation is rotated about an axis defined by a selected operating frequency as the operating temperature of the integrated circuit changes.

15. A device, comprising:
an integrated circuit programmed with an operating surface equation that defines an operating surface as a function of operating voltage, operating frequency, at least one additional operating factor, and leakage current;
wherein an operating voltage of the integrated circuit at a given operating frequency is determined by the integrated circuit evaluating the operating surface equation at the given operating frequency, a current value of the at least one additional operating factor, and at least one leakage current value fused into the device, wherein the leakage current value is determined during a test of the integrated circuit;
wherein the integrated circuit is configured to detect a change in the current value of the at least one additional operating factor and to adjust the operating voltage based on the change.

16. The device of claim 15, wherein the integrated circuit is allowed to operate at any operating frequency within a specified operating frequency range, the specified operating frequency range being determined by the operating surface equation.

17. The device of claim 15, wherein the at least one operating factor comprises a number of active execution units and, when the number of active execution units increases, a slope of the operating surface relative to operating frequency increases compared to the operating surface when the number of active execution units is lower.

18. The device of claim 15, wherein the at least one operating factor comprises an age of the integrated circuit and, when the age of the integrated circuit increases, the operating surface is offset, on the operating voltage axis, above the operating surface at the lower age.

19. The device of claim 18, wherein the offset is a selected amount for a selected increase in the age of the integrated circuit.

20. The device of claim 15, wherein the at least one operating factor comprises an operating temperature of the integrated circuit and, when the operating temperature of the integrated circuit changes, the operating surface is rotated about an axis defined by a selected operating frequency.

* * * * *